US009116794B2

United States Patent
Shirai

(10) Patent No.: US 9,116,794 B2
(45) Date of Patent: Aug. 25, 2015

(54) STORAGE DEVICE DATA PROTECTION SYSTEM

(75) Inventor: Tatsuhiro Shirai, Kyoto (JP)

(73) Assignee: NINTENDO CO., LTD., Kyoto (JP)

(*) Notice: Subject to any disclaimer, the term of this patent is extended or adjusted under 35 U.S.C. 154(b) by 51 days.

(21) Appl. No.: 13/587,534

(22) Filed: Aug. 16, 2012

(65) Prior Publication Data

US 2013/0086310 A1 Apr. 4, 2013

(30) Foreign Application Priority Data

Sep. 30, 2011 (JP) ................................ 2011-217349

(51) Int. Cl.
*G06F 12/02* (2006.01)
*G11C 11/56* (2006.01)

(52) U.S. Cl.
CPC ............ *G06F 12/0246* (2013.01); *G11C 11/56* (2013.01); *G06F 2212/1032* (2013.01); *G06F 2212/7202* (2013.01); *G11C 11/5628* (2013.01)

(58) Field of Classification Search
USPC .................................................. 711/103, 163
See application file for complete search history.

(56) References Cited

U.S. PATENT DOCUMENTS

| | | | | |
|---|---|---|---|---|
| 5,809,558 | A * | 9/1998 | Matthews et al. .............. | 711/173 |
| 2005/0018488 | A1 | 1/2005 | Kim et al. | |
| 2010/0005228 | A1* | 1/2010 | Fukutomi et al. .............. | 711/103 |
| 2010/0185802 | A1* | 7/2010 | Asnaashari et al. ........... | 711/103 |
| 2010/0205358 | A1* | 8/2010 | Ishibashi ........................ | 711/103 |
| 2012/0233432 | A1* | 9/2012 | Feldman et al. ............... | 711/170 |

FOREIGN PATENT DOCUMENTS

JP 2005-32431 2/2005

OTHER PUBLICATIONS

Wang et al. "3D-FlashMap: A Physical-Location-Aware Block Mapping Strategy for 3D NAND Flash Memory." Mar. 2012. IEEE. Date 2012. pp. 1307-1312.*

* cited by examiner

*Primary Examiner* — Nathan Sadler
(74) *Attorney, Agent, or Firm* — Nixon & Vanderhye P.C.

(57) ABSTRACT

An exemplary embodiment provides a non-transitory storage medium encoded with a computer readable program executable by the computer, for writing data in a semiconductor storage device capable of storing a plurality of bits in one memory cell. The program causes the computer to perform an allocation step of allocating a first area for storing first data in a storage area of a semiconductor storage device and a writing step of writing the first data only in an area of use, with a prescribed size from a boundary of the first area being defined as a protection area and a remaining area being defined as the area of use in response to a request for writing the first data.

19 Claims, 11 Drawing Sheets

FIG.3
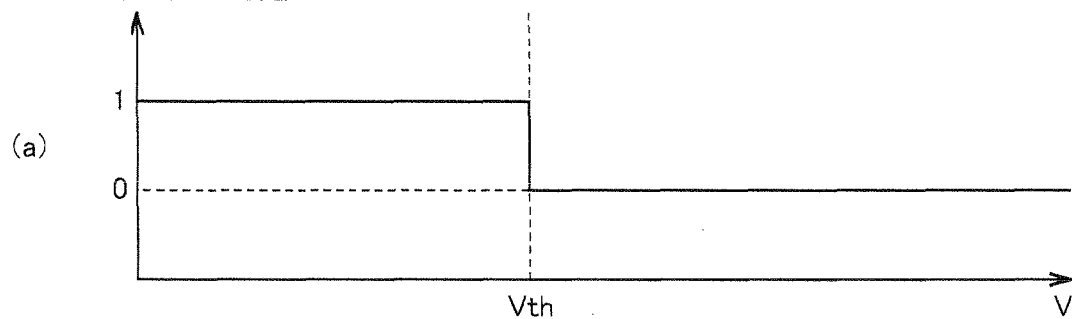
(a)
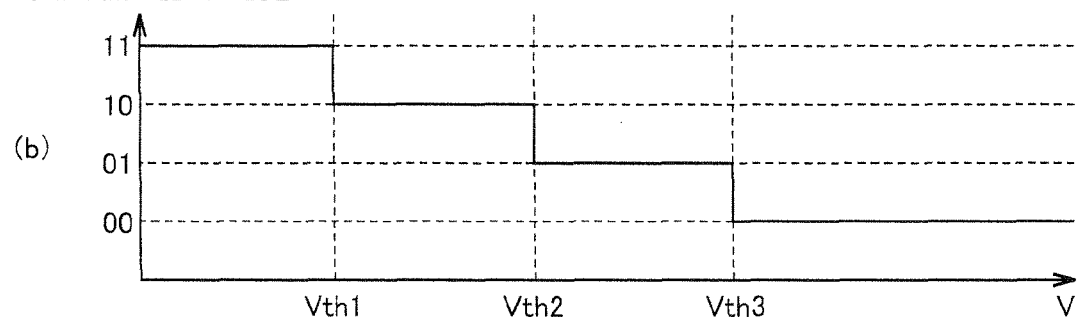
(b)

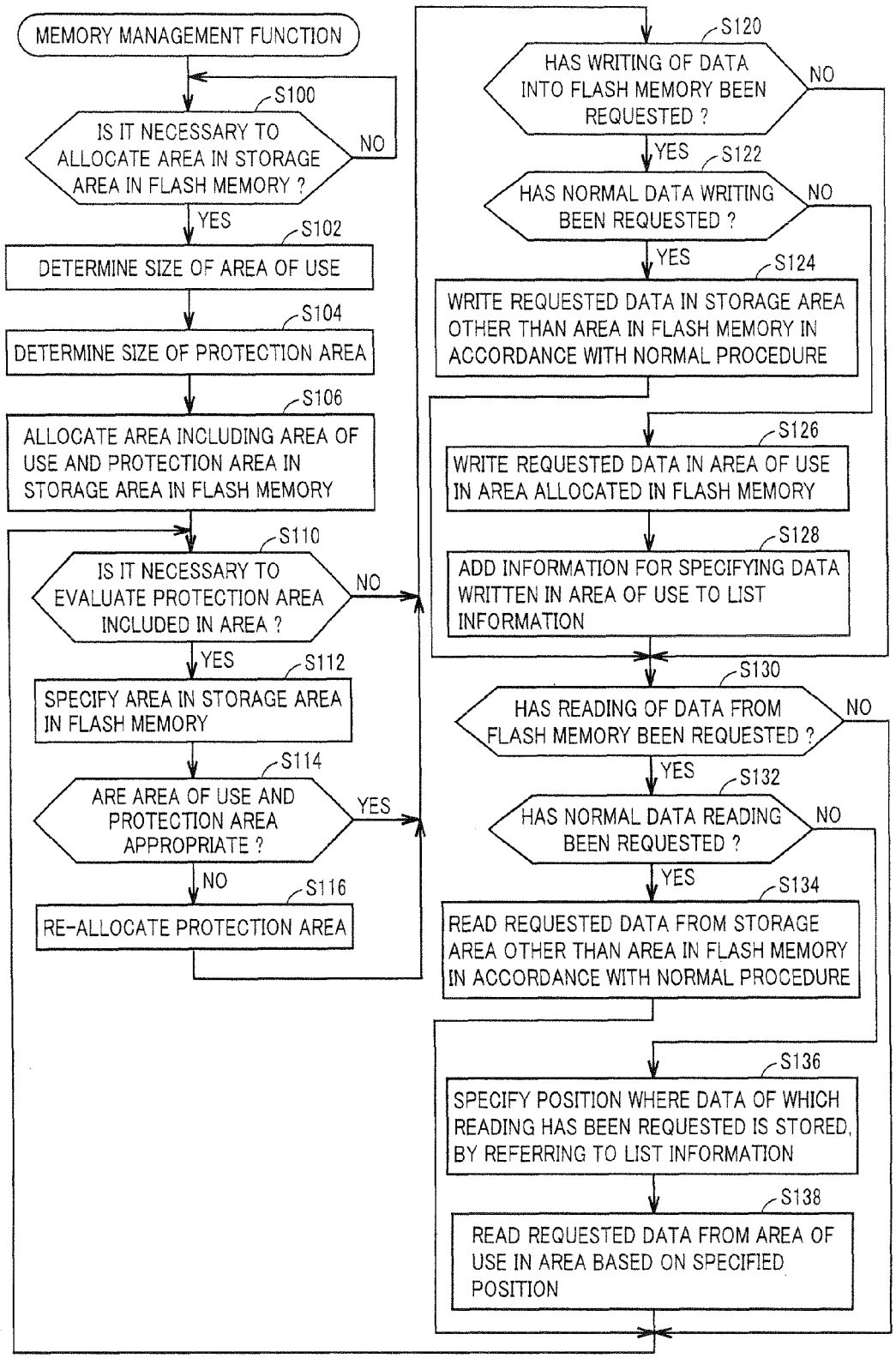

STORAGE DEVICE DATA PROTECTION SYSTEM

This nonprovisional application is based on Japanese Patent Application No. 2011-217349 filed with the Japan Patent Office on Sep. 30, 2011, the entire contents of which are hereby incorporated by reference.

FIELD

The invention generally relates to a non-transitory storage medium encoded with a computer readable program for writing data in a semiconductor storage device capable of storing a plurality of bits in one memory cell, an information processing system therefor, an information processing apparatus therefor, and an information processing method therefor.

BACKGROUND AND SUMMARY

With increase in storage capacity, lower cost, or the like of a semiconductor storage device (for example, a flash memory) in recent years, applications of a semiconductor storage device have been expanded. Typically, a semiconductor storage device is made use of in such a state as being contained in various apparatuses or in a removable form.

For such a semiconductor storage device, from a point of view of increase in storage capacity and lower cost, a technique for storing a plurality of bits in one storage element (memory cell) has been developed. A conventional semiconductor storage device in which one memory cell holds 1-bit data is referred to as an SLC (Single Level Cell) type, whereas such a semiconductor storage device as above is referred to as an MLC (Multi Level Cell) type in the sense that one memory cell holds data of a plurality of bits. Since the MLC type semiconductor storage device can hold data of a plurality of bits in one memory, it can be greater in capacity than the SLC type, on condition that the number of memory cells is the same.

In writing and reading data into and from the MLC type semiconductor storage device as described above, when a memory cell in which data to be accessed is stored is accessed, the memory cell to be accessed may have stored data other than data of interest. Namely, (respective parts of) two types of data may be stored in the same memory cell.

Under such circumstances, if some kind of error occurs in a memory cell itself of interest or in a portion managing the memory cell of interest at the time of access involved with certain data, data other than data to be accessed may also be affected.

An exemplary embodiment provides a non-transitory storage medium encoded with a computer readable program capable of protecting specific data against an error caused by access to another piece of data. Other exemplary embodiments provide an information processing system, an information processing apparatus, and an information processing method capable of protecting specific data against an error caused by access to another piece of data.

An exemplary embodiment provides a non-transitory storage medium encoded with a computer readable program executable by a computer, for writing data in a semiconductor storage device capable of storing a plurality of bits in one memory cell. The program causes the computer to perform an allocation step of allocating a first area for storing first data in a storage area of the semiconductor storage device and a writing step of writing the first data only in an area of use, with a prescribed size from a boundary of the first area being defined as a protection area and a remaining area being defined as the area of use in response to a request for writing the first data.

According to the exemplary embodiment, the first data is written only in the area of use, and an area adjacent to the area of use is allocated as the protection area. This protection area can prevent another piece of data from being written in the area adjacent to the first data. Thus, the first data can be protected against an error caused by access to another piece of data.

In an exemplary embodiment, the allocation step includes the step of writing information for handling the first area as a single piece of data in the semiconductor storage device.

According to the exemplary embodiment, since the first area is handled as a single piece of data, such a configuration that a protection area is allocated adjacent to the area of use can be maintained.

In an exemplary embodiment, the allocation step includes the step of writing file management information for handling the first area as a single file in the semiconductor storage device.

According to the exemplary embodiment, since not only a computer where the first area is allocated but also other computers handle the first area as a single file, such a situation that a protection area allocated adjacent to the area of use is deleted can be avoided.

In an exemplary embodiment, the allocation step includes the step of writing area management information for distinguishing between the area of use and the protection area included in the first area in the semiconductor storage device.

According to the exemplary embodiment, the first area is handled as a single piece of data, while the area of use where the first data is stored can readily be specified.

In an exemplary embodiment, the storage area of the semiconductor storage device includes a second area for managing a file stored in the storage area, and the area management information is stored in the second area.

According to the exemplary embodiment, the first area can be managed by using management information the same as that for another file stored in the storage area of the semiconductor storage device.

In an exemplary embodiment, the area management information is stored in the protection area.

According to the exemplary embodiment, a protection area basically not used for storage of data can effectively be made use of.

In an exemplary embodiment, the area management information includes an offset value indicating a size from a boundary of a third area for storing second data different from the first data to the area of use.

According to the exemplary embodiment, since an offset value is used, processing for distinguishing between the area of use and the protection area can be facilitated.

In an exemplary embodiment, the area management information includes a parameter for calculating a start position of the area of use in the first area in accordance with a prescribed calculating formula.

According to the exemplary embodiment, the area of use and the protection area can be distinguished from each other without separately storing such a value as an offset value. In addition, by concealing a calculating formula for distinguishing between the area of use and the protection area, even when another computer or the like makes an access, security for data stored in the area of use can be enhanced.

In an exemplary embodiment, the allocation step includes the step of determining a size of the protection area in association with a size of a block constituted of a plurality of memory cells in the semiconductor storage device.

According to the exemplary embodiment, by determining a size of the protection area in association with structural characteristics of the semiconductor storage device, first data stored in the area of use can reliably be protected.

In an exemplary embodiment, the size of the protection area is determined in association with a block which is an erase unit in the semiconductor storage device.

According to the exemplary embodiment, by allocating the protection area to a plurality of memory cells in association with a block which is an erase unit, data in which may be destructed, the first data stored in the area of use can reliably be protected.

In an exemplary embodiment, the protection area having at least a size of the block which is an erase unit is allocated.

According to the exemplary embodiment, at whichever position an area where the first data is to be stored may be arranged, storage of the first data and another piece of data in a block which is one erase unit can be prevented. Therefore, the first data stored in the area of use can reliably be protected.

In an exemplary embodiment, the protection area is allocated to include an area from the area of use to a boundary corresponding to a boundary of the block.

According to the exemplary embodiment, storage of the first data and another piece of data in a certain block can be prevented. Therefore, the first data stored in the area of use can reliably be protected.

In an exemplary embodiment, the allocation step includes the step of obtaining a block size regarding a semiconductor storage device to be accessed, by obtaining identification information of the semiconductor storage device to be accessed and referring to a table in which the identification information and a block size are brought in correspondence with each other.

According to the exemplary embodiment, though a size of a block is different depending on difference in characteristic value of the semiconductor storage device, the protection area can be set to an appropriate size in spite of such a difference in block size.

In an exemplary embodiment, the allocation step includes the step of obtaining by accessing a semiconductor storage device to be accessed, a block size regarding the semiconductor storage device.

According to the exemplary embodiment, the protection area can be set to an appropriate size in accordance with the semiconductor storage device in which the first data is to be written.

In an exemplary embodiment, the writing step includes the step of writing a plurality of files in the first area handled as a single file.

According to the exemplary embodiment, since a plurality of files can be written in a common area of use, efficiency in use of a storage capacity of the semiconductor storage device can be enhanced.

In an exemplary embodiment, the plurality of files are managed as files in a file system different from a file system handling the single file.

According to the exemplary embodiment, for example, since a general-purpose file system and a special file system which only a particular model or application can use can be mounted, data can be stored in accordance with an application thereof.

In an exemplary embodiment, the program causes the computer to further perform an area specifying step of specifying the first area where the first data is stored in the storage area of the semiconductor storage device, an evaluation step of evaluating appropriateness of the area of use and the protection area allocated to the specified first area, in association with a block regarding the semiconductor storage device, and a re-allocation step of re-allocating the protection area when evaluation as inappropriate is made in the evaluation step.

According to the exemplary embodiment, even when the first data is written in another semiconductor storage device, a proper protection area can be set in the semiconductor storage device in which the first data is written.

An exemplary embodiment provides an information processing system including at least one operation processing unit and a non-transitory storage medium encoded with a computer readable program executed by the operation processing unit. The information processing system includes an allocation unit for allocating a first area for storing first data in a storage area of a semiconductor storage device. The semiconductor storage device is configured to store a plurality of bits in one memory cell. The information processing system includes a writing unit for writing the first data only in an area of use, with a prescribed size from a boundary of the first area being defined as a protection area and a remaining area being defined as the area of use in response to a request for writing the first data.

According to the exemplary embodiment, the first data is written only in the area of use, and an area adjacent to the area of use is allocated as the protection area. This protection area can prevent another piece of data from being written in the area adjacent to the first data. Thus, the first data can be protected against an error caused by access to another piece of data.

An exemplary embodiment provides an information processing apparatus incorporating a function to write data in a semiconductor storage device capable of storing a plurality of bits in one memory cell. The information processing apparatus includes an allocation unit for allocating a first area for storing first data in a storage area of the semiconductor storage device and a writing unit for writing the first data only in an area of use, with a prescribed size from a boundary of the first area being defined as a protection area and a remaining area being defined as the area of use in response to a request for writing the first data.

According to the exemplary embodiment, the first data is written only in the area of use, and an area adjacent to the area of use is allocated as the protection area. This protection area can prevent another piece of data from being written in the area adjacent to the first data. Thus, the first data can be protected against an error caused by access to another piece of data.

An exemplary embodiment provides an information processing method for writing data in a semiconductor storage device capable of storing a plurality of bits in one memory cell, which is performed in a computer. The information processing method includes an allocation step of allocating a first area for storing first data in a storage area of the semiconductor storage device and a writing step of writing the first data only in an area of use, with a prescribed size from a boundary of the first area being defined as a protection area and a remaining area being defined as the area of use in response to a request for writing the first data.

According to the exemplary embodiment, the first data is written only in the area of use, and an area adjacent to the area of use is allocated as the protection area. This protection area can prevent another piece of data from being written in the area adjacent to the first data. Thus, the first data can be protected against an error caused by access to another piece of data.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows an exemplary illustrative non-limiting diagram for illustrating a difference between an SLC type and an MLC type.

FIG. 11 shows an exemplary illustrative non-limiting flowchart illustrating a processing procedure involved with the memory management function according to the exemplary embodiment.

DETAILED DESCRIPTION OF NON-LIMITING EXAMPLE EMBODIMENTS

Figure 1:
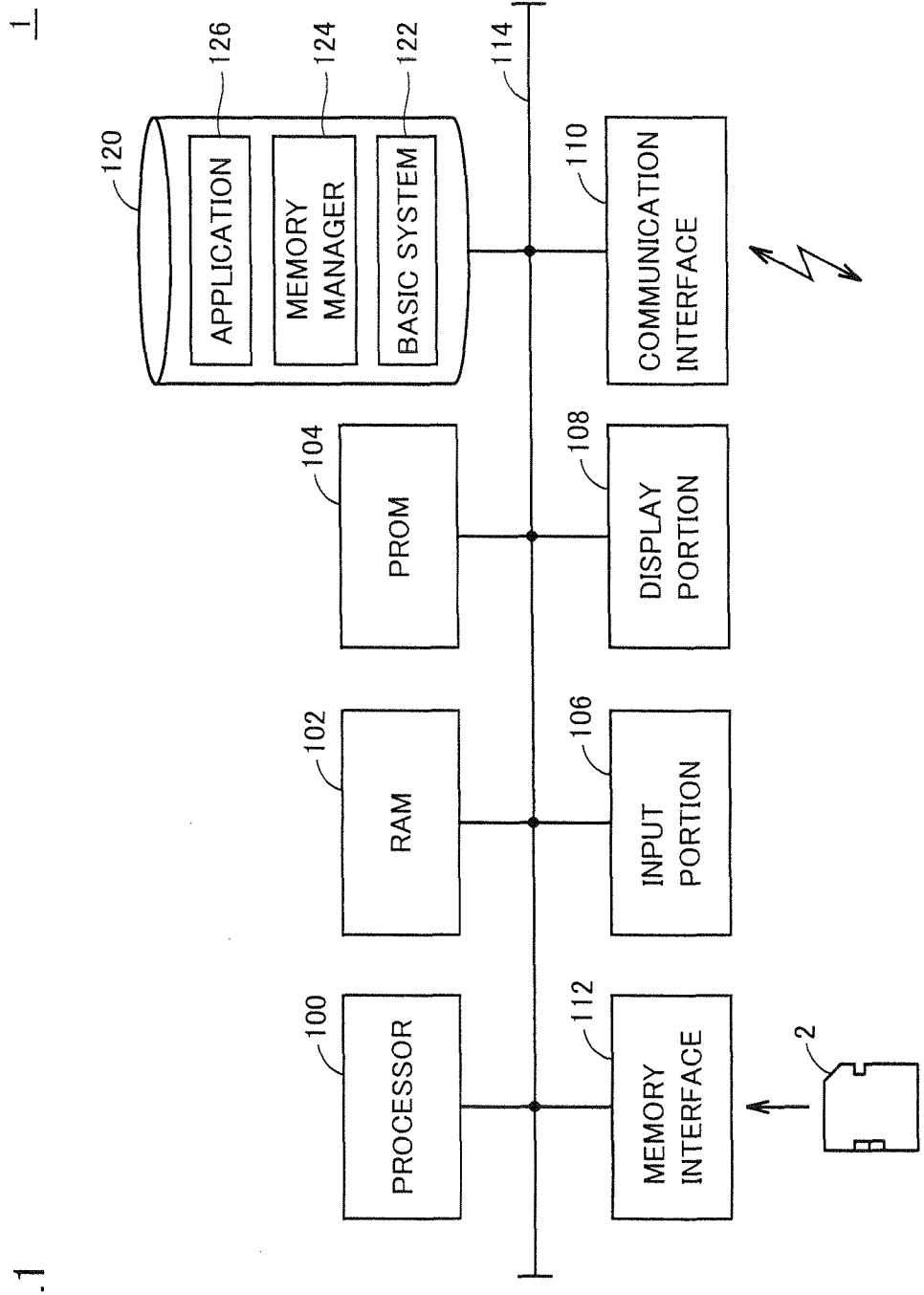
FIG. 1 shows an exemplary illustrative non-limiting block diagram illustrating a configuration of an information processing apparatus incorporating a memory management function according to an exemplary embodiment.

Some embodiments will be described in detail with reference to the drawings.
The same or corresponding elements in the drawings have the same reference characters allotted and description thereof will not be repeated.

<A. Overview>

For example, a memory management function according to the embodiment prevents, in storing relatively important data or the like, the important data from being destructed by writing of data in an adjacent area. Specifically, an area of use where data should essentially be stored is allocated, and a protection area in which storage of another piece of data is prohibited is set adjacent to that area of use.

<B. Apparatus Configuration>

A configuration of an information processing apparatus 1 incorporating the memory management function according to the embodiment will be described with reference to FIG. 1.

Information processing apparatus 1 includes a processor 100, a RAM (Random Access Memory) 102, a PROM (Programmable Read-Only Memory) 104, an input portion 106, a display portion 108, a communication interface 110, a memory interface 112, and an auxiliary storage 120.

Processor 100 is an operation processing unit responsible for overall control of information processing apparatus 1 and it is configured with a CPU (Central Processing Unit), an FPGA (Field Programmable Gate Array), and the like. RAM 102 functions as a working memory or the like for a program executed in processor 100. RAM 102 is typically implemented by such a volatile memory as a DRAM (Dynamic Random Access Memory). PROM 104 is a semiconductor storage device for storing data in a non-volatile manner. PROM 104 is typically implemented by such a non-volatile memory as a flash memory. Details of this PROM 104 will be described later.

Input portion 106 accepts a user's operation and outputs operation contents to processor 100. Display portion 108 presents to the user, results of processing by processor 100, image data, and the like. Display portion 108 is typically implemented by an LCD (Liquid Crystal Display), an organic EL (Electro Luminescence) display, or the like.

Communication interface 110 provides a function to exchange data with another apparatus through a wire, by radio, or the like. Communication interface 110 is typically implemented by an Ethernet® controller, a wireless LAN controller, or the like.

Memory interface 112 is configured to be removable from a portable memory device 2, and it writes and reads data into and from portable memory device 2. Various semiconductor storage devices such as an SD (Secure Digital) memory card and a CF (Compact Flash) memory card can be used as such portable memory device 2. Likewise PROM 104, details of this portable memory device 2 will also be described later.

Auxiliary storage 120 stores a program executed by processor 100 or the like, image data, or the like in a non-volatile manner. Auxiliary storage 120 is typically implemented by a hard disk magnetically storing data, a flash memory, a memory card, or the like. Auxiliary storage 120 may also removably be configured, and combination of a plurality of devices may be mounted as such.

Auxiliary storage 120 stores a basic system 122, a memory manager 124, and an application 126 by way of example. Basic system 122 provides an environment for making use of each piece of hardware constituting information processing apparatus 1 for execution of various applications. Memory manager 124 is a main program for realizing the memory management function according to the present embodiment. Namely, memory manager 124 is at least a part of a program for writing data in a semiconductor storage device capable of storing a plurality of bits in one memory cell. Application 126 is a program operating in an environment provided as a result of execution of basic system 122 by processor 100, and it may be a game, a business application, a browser application, or the like.

It is noted that information processing apparatus 1 may incorporate such image pick-up means as a camera. By incorporating such image pick-up means, information processing apparatus 1 itself can also generate image data.

<C. Semiconductor Storage Device>

The semiconductor storage device on which the memory management function according to the present embodiment is based will be described.

[c1: Overview]

The memory management function according to the present embodiment is directed to the semiconductor storage device for storing data in a non-volatile manner, such as a flash memory. More specifically, it is directed to (what is called an MLC (Multi Level Cell) type) semiconductor storage device capable of storing a plurality of bits in one memory cell. Namely, the memory management function according to the present embodiment manages writing and reading of data into and from the MLC type semiconductor storage device.

Currently, an MLC type flash memory is common as such an MLC type semiconductor storage device. Though there is a structural difference among such MLC type flash memories, such as a NAND type and a NOR type, the memory management function according to the present embodiment is applicable to any structure. In addition, the memory management function according to the present embodiment is also applicable to a custom mask ROM (xtraROM) in which a plurality of functions such as a security function are integrated into one chip, or the like, in addition to the flash memory.

[c2: Circuit Configuration]

Figure 2:
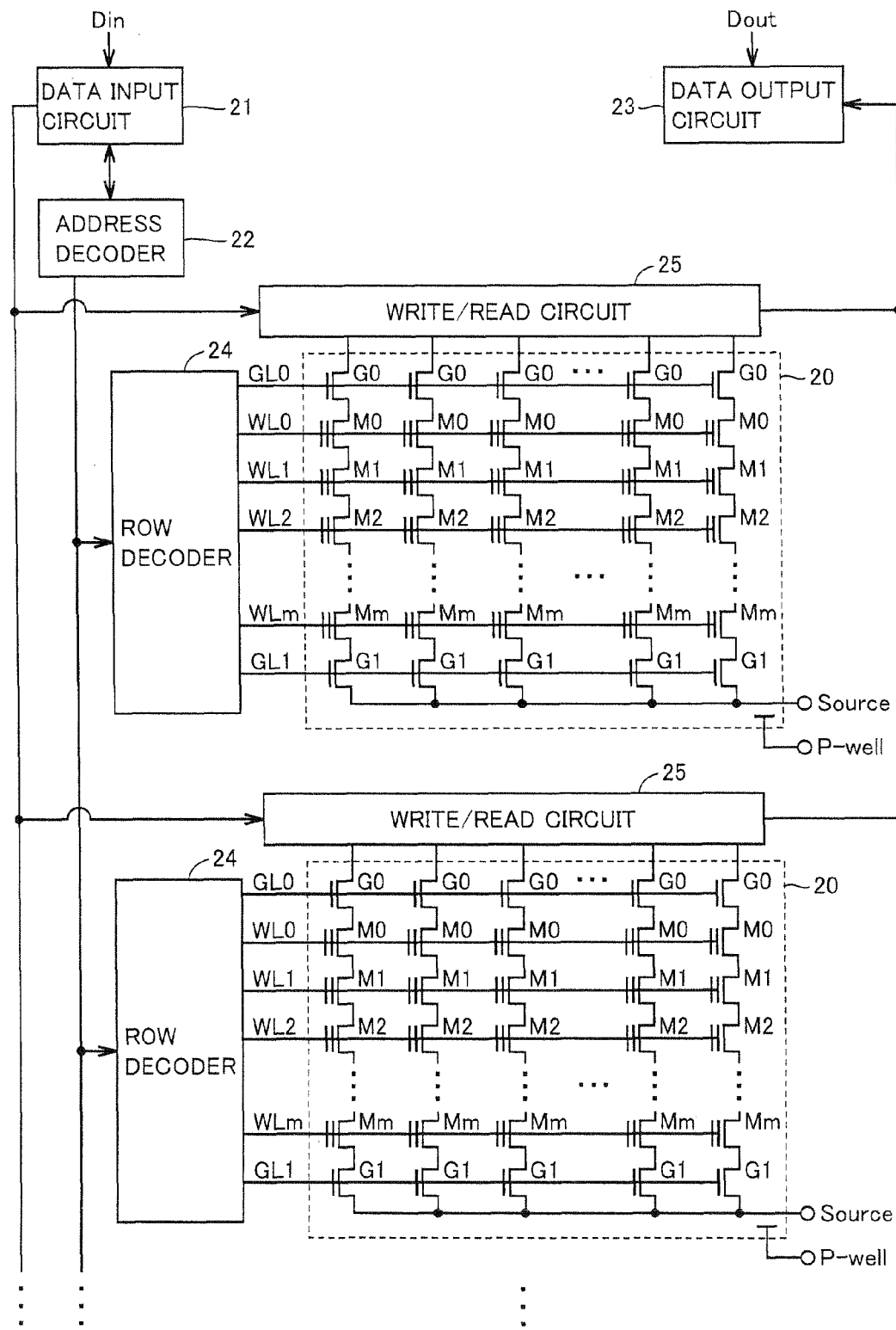
FIG. 2 shows an exemplary illustrative non-limiting circuit configuration of a portable memory device shown in FIG. 1

One example of a circuit configuration of portable memory device 2 will be described with reference to FIG. 2. FIG. 2 shows a NAND type flash memory by way of typical example for realizing portable memory device 2.

Portable memory device 2 includes a data input circuit 21, an address decoder 22, a data output circuit 23, and a plurality of memory arrays 20. A row decoder 24 and a write/read circuit 25 are associated with each of memory arrays 20.

Data input circuit 21 outputs externally input data (Din) to write/read circuit 25 corresponding to a memory cell, which is a destination to be written, and outputs an address of the memory cell, which is the destination to be written, to address decoder 22. Address decoder 22 provides a drive command to row decoder 24 corresponding to the address designated by data input circuit 21.

Each of memory arrays 20 includes a plurality of cell strings (columns) having a plurality of memory cells M0, M1, . . . , Mm connected in series. Gate transistors G0 and G1 are connected to respective opposing ends of each cell string. In addition, word lines WL0, WL1, WLm are connected to gates of memory cells M0, M1, . . . , Mm constituting each cell string, respectively.

Row decoder 24 drives word line WL in response to a drive command from address decoder 22. A memory cell corresponding to driven word line WL is activated. In addition, row decoder 24 drives gate lines GL0 and GL1 in accordance with a memory cell that is accessed. As gate line GL0 is driven, one end of the cell string is electrically connected to write/read circuit 25. Alternatively, as gate line GL1 is driven, the other end of the cell string is electrically connected to a source potential (Source).

Write/read circuit 25 is electrically connected to a memory cell selected by an operation of the row decoder as described above. In a data writing operation, write/read circuit 25 injects charges corresponding to data into a floating gate of the selected memory cell. Data resulting from this charge injection is written (programmed).

On the other hand, in a data reading operation, write/read circuit 25 reads which value has been programmed, by comparing a voltage generated in accordance with charges held by the selected memory cell with a threshold voltage. Write/read circuit 25 outputs read data (Dout) to data output circuit 23.

Data output circuit 23 outputs data read by write/read circuit 25 to the outside. In a NAND type flash memory, structurally, writing is carried out by a prescribed data amount (typically, 4 k bytes). Therefore, a page buffer may be provided in write/read circuit 25. It is noted that, in a NOR type flash memory, bit-by-bit data access can be made.

Regarding an operation for erase in a flash memory, by applying a prescribed potential to a well layer (P-well) where a memory cell is formed, charges that have been injected into a floating gate of each memory cell are released. Since this well layer is formed commonly to a plurality of memory cells, at the time of erase, release is collectively carried out in a plurality of memory cells on a common well layer. The number of memory cells defined as a unit for such an erasing operation will be hereinafter referred to as an "erase block" or a "block".

[c3: SLC and MLC]

As described above, in a flash memory, a value stored in each memory cell is read by injecting charges in a floating gate and comparing a voltage generated as a result of injection of the charges with a predetermined threshold voltage.

A difference between the SLC type and the MLC type will be described with reference to FIG. 3. FIG. 3 shows in (a), relation between a voltage value and a programmed value in a memory cell in an SLC type flash memory, and shows in (b), relation between a voltage value and a programmed value in a memory cell in an MLC type flash memory.

As shown in (a) of FIG. 3, in the SLC type, which of "1" and "0" is programmed is determined based on comparison between a voltage V generated in a memory cell and one threshold value Vth and on whether the voltage is higher or lower than threshold value Vth.

Meanwhile, as shown in (b) of FIG. 3, in the MLC type, which of "11", "10", "01", and "00" is programmed is determined by preparing three types of threshold values (Vth1, Vth2, Vth3) to be compared with voltage V generated in a memory cell and determining between which threshold voltages voltage V generated in the memory cell is present. It is noted that a greater number of threshold values may be set so that more bits are stored.

With such a method, a plurality of bits can be stored in one memory cell.

[c4: Address Allocation]

As described above, in the MLC type flash memory, since each memory cell stores a plurality of bits, a cell address does not match with an address managed by a host.

Figure 4:
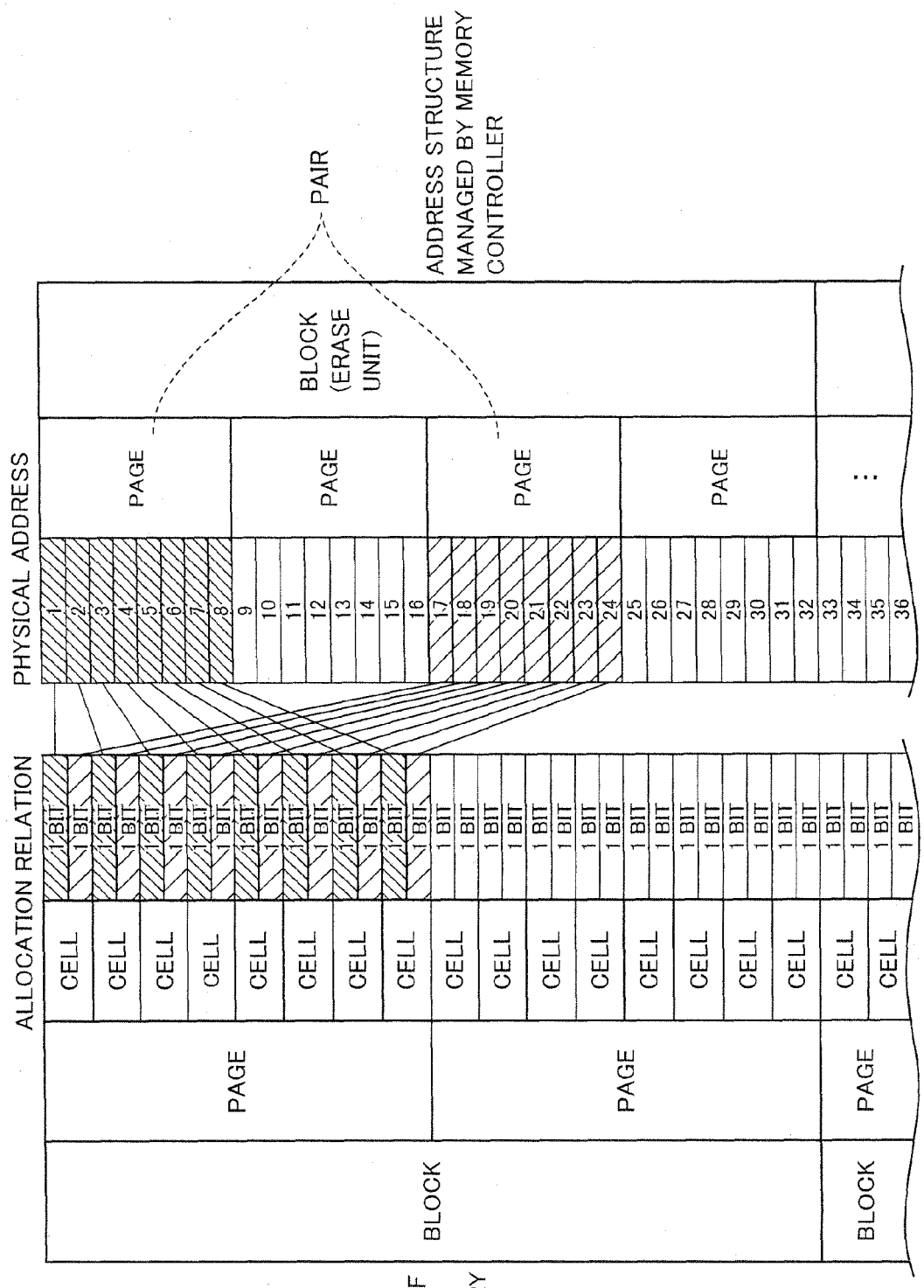
FIG. 4 shows an exemplary illustrative non-limiting diagram illustrating correspondence between a hardware structure in an MLC type flash memory and an address structure managed by a memory controller.

One example of correspondence between a hardware structure in an MLC type flash memory and an address structure managed by a memory controller will be described with reference to FIG. 4. FIG. 4 shows an example where one cell stores data of 2 bits. A unit of cells sharing a lead in an MLC type flash memory will be referred to as a "page in a physical structure." For the sake of convenience of illustration, FIG. 4 shows an example where 8 cells are included in each page in a physical structure, however, an example is not limited thereto.

As described above, a plurality of cells formed on a common well layer are referred to as a "block". An "erase block" in the present embodiment is set and managed so as to match with a block in a physical structure of this MLC type flash memory. Namely, as will be described later, a host (memory controller) accessing the MLC type flash memory erases data block by block, the block corresponding to the physical structure of the MLC type flash memory.

On the other hand, from a viewpoint of the host (memory controller) accessing the MLC type flash memory, a page address is provided as a logical address. A page managed by this host will be referred to as a "page in a logical structure" for distinction from the "page in a physical structure" described above. For the sake of convenience of illustration, FIG. 4 shows an example where 8 cells are included in each page in the logical structure, however, the example is not limited thereto.

In accordance with the number of bits stored in one cell, the page in the physical structure and the page in the logical structure are brought in correspondence with each other. In the example shown in FIG. 4, since one cell stores data of 2 bits, two pages in the logical structure are allocated to one page in the physical structure. Namely, a pair of two pages in the logical structure is brought in correspondence with one page in the physical structure. It is not always the case that successive addresses are allocated to the paired pages in the logical structure.

It is noted that, from a viewpoint of a block as one unit, a series of continuous pages in the logical structure corresponds to a block formed on the common well layer.

[c5: Data Destruction]

There is a case where a single piece of data is stored across a plurality of erase blocks in the data structure shown in FIG. 4. Namely, even though pages in the logical structure are continuous, they may belong to blocks different in destination to be written. In a flash memory, a voltage may be applied collectively to a plurality of memory cells formed on a common well layer. Therefore, in writing data in a flash memory, when a writing operation is interrupted by cut-off of system power supply, a release operation in a live wire state, or the like, an error may be caused in the entire erase block, which is a destination to be written. Therefore, another piece of data stored in an erase block where the error has been caused may also be destructed.

Figure 5:
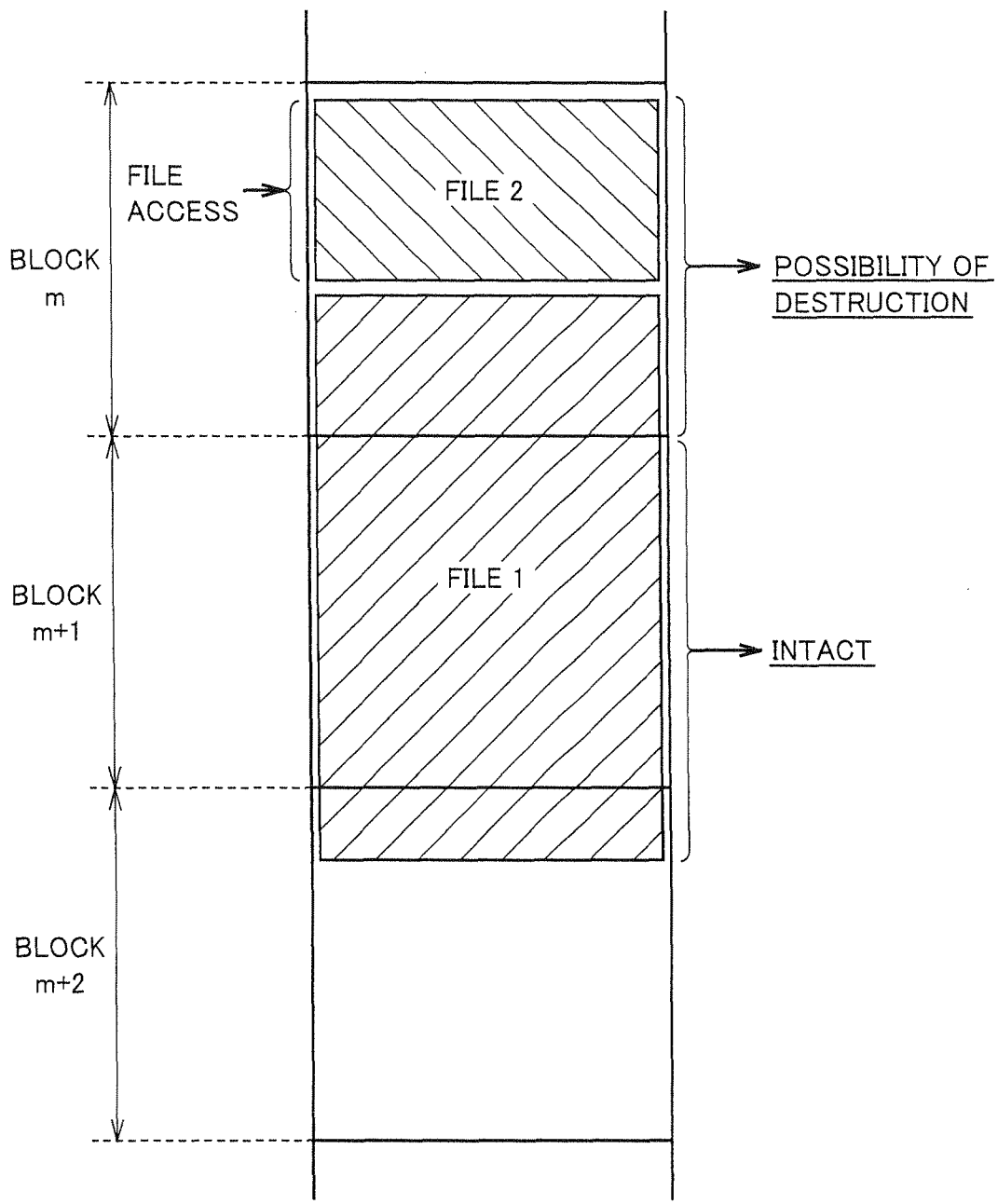
FIG. 5 shows an exemplary illustrative non-limiting diagram for illustrating such a phenomenon that data adjacently stored in a physical memory space is destructed by access to the data.

Such a phenomenon that data adjacently stored in a physical memory space is destructed by access to the data will be described with reference to FIG. 5.

For example, it is assumed that a file 1 is stored across a "block m" and a "block m+1". A case where a file 2 is written in an area including "block m" in this state is considered. It is assumed that some kind of error occurs in "block m" in the middle of writing of this file 2. In this case, data that has been stored in the memory cells constituting "block m" is destructed and access not only to file 2 to be accessed but also to file 1 will be unsuccessful. More specifically, a portion of file 1 included in "block m" may actually be destructed, whereas a portion included in "block m+1" is unlikely to be destructed by access to file 2. Even in such a state, access to files as a whole will no longer be successful.

Namely, in the case where a certain file is stored across a plurality of erase blocks, an error caused in one erase block does not permit access as a file including data stored in an area corresponding to the other erase block.

As a specific example, an error is caused at the time when another image file is about to be written in a flash memory where an image file has previously been stored, and accordingly, the image file stored previously may not successfully be accessed either.

Thus, in the MLC type flash memory, when a certain file is accessed (written), a file irrelevant to the accessed file (a file including data stored in a block common to the file, which is a destination to be written) may be destructed.

Then, with the memory management function according to the present embodiment, data stored at an adjacent position is prevented from being destructed by an operation to write into an adjacent area in a physical memory space and access to a file including the destructed data is prevented from becoming impossible.

<D. Memory Management Function>

Details of the memory management function according to the present embodiment will be described hereinafter.

[d1: Basic Concept]

In order to avoid such a situation that a single piece of data (a single file) is stored across a plurality of erase blocks as described above, in the present embodiment, an area not storing data is added to one side or opposing sides of an area for essentially storing data.

Figure 6:
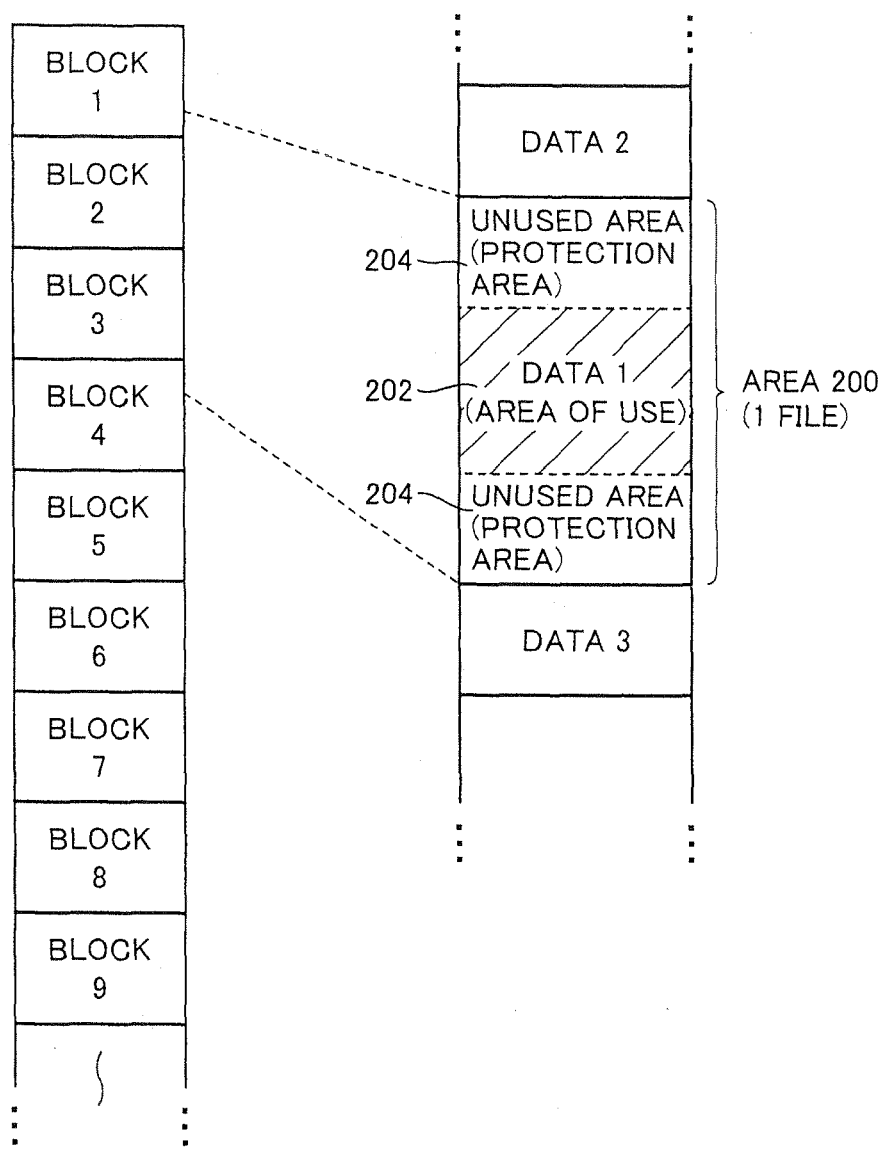
FIG. 6 shows an exemplary illustrative non-limiting diagram for illustrating a storage area allocated by the memory management function according to the exemplary embodiment.

A storage area allocated by the memory management function according to the present embodiment will be described with reference to FIG. 6. FIG. 6 shows an example where data 1 is stored in a flash memory.

In the present embodiment, in a logical memory space, an unused area not used for storage of data is added adjacent to "data 1" of which storage is desired. Namely, the memory management function according to the present embodiment allocates an area 200 for storing data 1 in a storage area of a flash memory (logical memory space). Here, allocated area 200 is preferably handled as one file. This method for handling as one file will be described later. The memory management function defines a prescribed size from a boundary of the allocated area as an unused area (protection area) 204 and defines a remaining area as an area of use 202, in response to a request for writing data 1. Then, the memory management function writes data 1 only in the area of use. Thus, in the present embodiment, in order to protect data 1 against an error caused by writing of data in an adjacent area, a protection area (buffer area) is provided on one side or on each of opposing sides of an area for storing data 1. By setting a size of a protection area so as to avoid influence by an error caused by data written in an adjacent area, unexpected destruction of data 1 can be prevented. By setting such a protection area having an appropriate size, influence by an error caused at the time when another piece of data is written can be avoided.

[d2: Size of Protection Area]

In the present embodiment, area of use 202 used for data storage is allocated and protection area 204 is allocated on one side or on each of opposing sides thereof. A size of this protection area will be described.

As described above, in the case where data is stored across a plurality of erase blocks, there is influence by an error caused by access to adjacent data. Therefore, a size of protection area 204 is preferably determined in association with a size of a block constituted of a plurality of similarly affected memory cells in a flash memory. More specifically, a size of protection area 204 is preferably determined in association with a size of an erase block. Namely, a size of protection area 204 is determined in association with a block which is an erase unit in the flash memory.

More specifically, in the case where data is written from the host into the flash memory, instead of using the entire allocated area 200, an area from a forward end of area 200 to a boundary of a first block and an area from a terminal end of area 200 to a boundary of a final block are regarded what is called a "sacrifice area" and they are not used for writing of data. Namely, protection area 204 is allocated to include an area from area of use 202 to a boundary corresponding to a boundary of an erase block.

If an address in the logical memory space corresponding to a boundary of an erase block has already been known, one erase block or all of the plurality of erase blocks should only be allocated to a single piece of data (a single file). Generally, however, correspondence between the physical memory space and the logical memory space as shown in FIG. 6 is unknown, and in many cases, it is difficult to obtain such correspondence.

Then, as one implementation, a size not smaller than one erase block should only be secured as protection area 204. Namely, the memory management function according to the embodiment allocates protection area 204 having at least a size of a block which is an erase unit. Thus, by arranging protection area 204 having a size not smaller than one erase block on each of opposing sides of area of use 202, data stored in area of use 202 can be protected, at whichever position area 200 may be stored.

Figure 7:
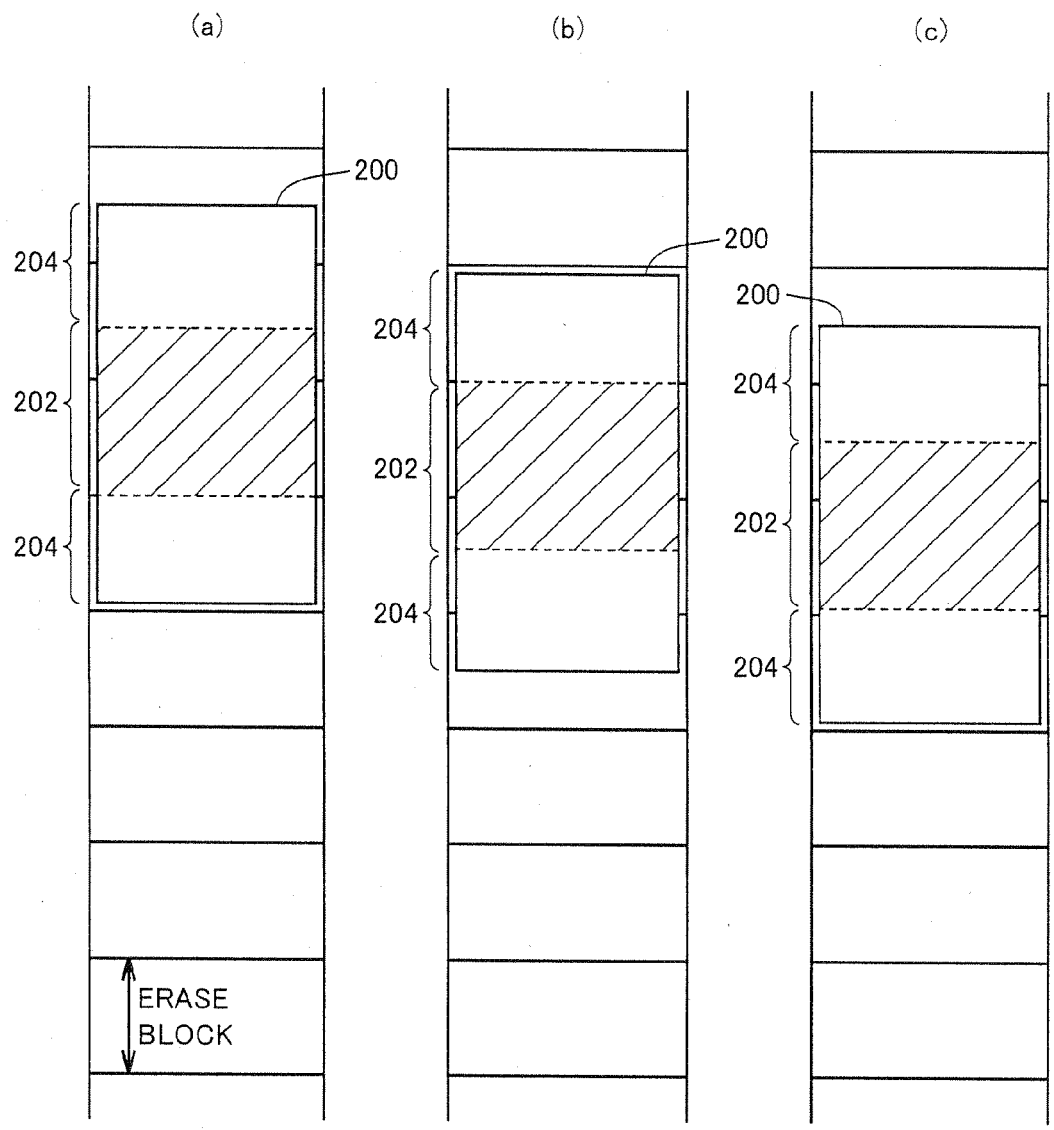
FIG. 7 shows an exemplary illustrative non-limiting diagram illustrating exemplary arrangement of an area including an area of use and a protection area.

Exemplary arrangement of area 200 including area of use 202 and protection area 204 is shown with reference to FIG. 7. A size of each protection area 204 shown in FIG. 7 is the same as a size of an erase block. FIG. 7 shows in (a), such a state that a terminal end of area 200 matches with a boundary of an erase block. FIG. 7 shows in (b), such a state that a forward end of area 200 matches with a boundary of an erase block. FIG. 7 shows in (c), such a state that neither of a forward end and a terminal end of area 200 matches with a boundary of an erase block.

As shown in (a) to (c) in FIG. 7, by setting a size of protection area 204 as large as the erase block, at whichever position area 200 may be allocated, writing of another piece of data in an erase block corresponding to area of use 202 can be avoided. Namely, the same erase block is never shared by area of use 202 and another piece of data. Therefore, even when correspondence between the physical memory space and the logical memory space is unknown, data stored in area of use 202 can be protected against an error caused by writing of data in an adjacent area.

It is noted that a unit of an erase block varies depending on a structure of a flash memory, a total capacity, a process, or the like. Therefore, in the case where a size of protection area 204 is determined in association with an erase block, a size of an erase block should be estimated or obtained.

(1) MOUNT EXAMPLE NO. 1

As a first mount example, a method of finding in advance a maximum value (512 k bytes or 2 M bytes) of a size of an erase block of commercially available flash memories and setting a size of protection area 204 to that maximum value is possible. By adopting such a method, whichever type of flash memory may be employed, protection area 204 corresponding to at least one erase block can be secured and hence data stored in area of use 202 can be protected.

(2) MOUNT EXAMPLE NO. 2

As a second mount example, identification information may be obtained from a flash memory of interest and a size of an erase block may be estimated from the obtained identification information. More specifically, an SD memory card or the like has stored therein various types of information on a flash memory used therefor (a manufacturer number, a product number, model information, a capacity, or the like), and a host can access such information. Then, such information on a flash memory of interest is obtained and a size of an erase block for each model of a flash memory is obtained in advance (for example, as a table). Then, by referring to the above, protection area 204 having an appropriate size in accordance with a flash memory to be accessed can be set.

Thus, by obtaining identification information of a flash memory to be accessed and referring to a table where identification information and a size of a block are brought in correspondence with each other, a size of an erase block in a flash memory to be accessed may be obtained. A size of protection area 204 is determined based on a thus obtained size of an erase block.

(3) MOUNT EXAMPLE NO. 3

As a third mount example, a size of an erase block may directly be obtained from a flash memory of interest. In the case of accessing a custom mask ROM or the like including a flash memory, or the like, a size of an erase block in a flash memory contained in such a custom mask ROM may directly be obtained as response. By adopting such a configuration, as the host accesses the custom mask ROM, a size of an erase block in a contained flash memory can directly be obtained and thus a size of an erase block can be determined. Thus, by accessing a flash memory to be accessed, a size of an erase block regarding the flash memory may be obtained.

(4) Others

In a custom mask ROM as described above, correspondence between the physical memory space and the logical memory space can also be obtained in advance. In such a case, it is not necessary to arrange protection area 204 as shown in FIG. 6 on opposing sides. Namely, a forward end of area of use 202 can be allocated to match with a boundary of an erase block and an area from a terminal end of area of use 202 to a boundary of a next erase block can also be allocated as protection area 204. In the case where such allocation is allowed, a size of protection area 204 which is a "sacrifice area" can be made smaller and a storage area in a flash memory can effectively be made use of.

[d3: Single File]

Not only information processing apparatus 1 incorporating the memory management function according to the present embodiment but also other information processing apparatuses can access portable memory device 2 shown in FIG. 1. Therefore, area 200 in accordance with the memory management function according to the present embodiment is also preferably allocated under a general-purpose file system. Then, with the memory management function according to the present embodiment, area 200 including area of use 202 and protection area 204 is handled as a single piece of data. Namely, even when another information processing apparatus accesses a flash memory in which area 200 is allocated, such an operation as copy of area 200 is allowed. More specifically, the memory management function according to the present embodiment writes information for handling area 200 as a single piece of data into a flash memory.

By way of example, for a current SD memory card, an FAT file system has been adopted as a file system. With this FAT file system, a linked list is stored in a master cluster (MBR: Master Boot Record) and information on a stored file and/or directory (a master cluster number and a used cluster) is defined in this linked list.

Figure 8:
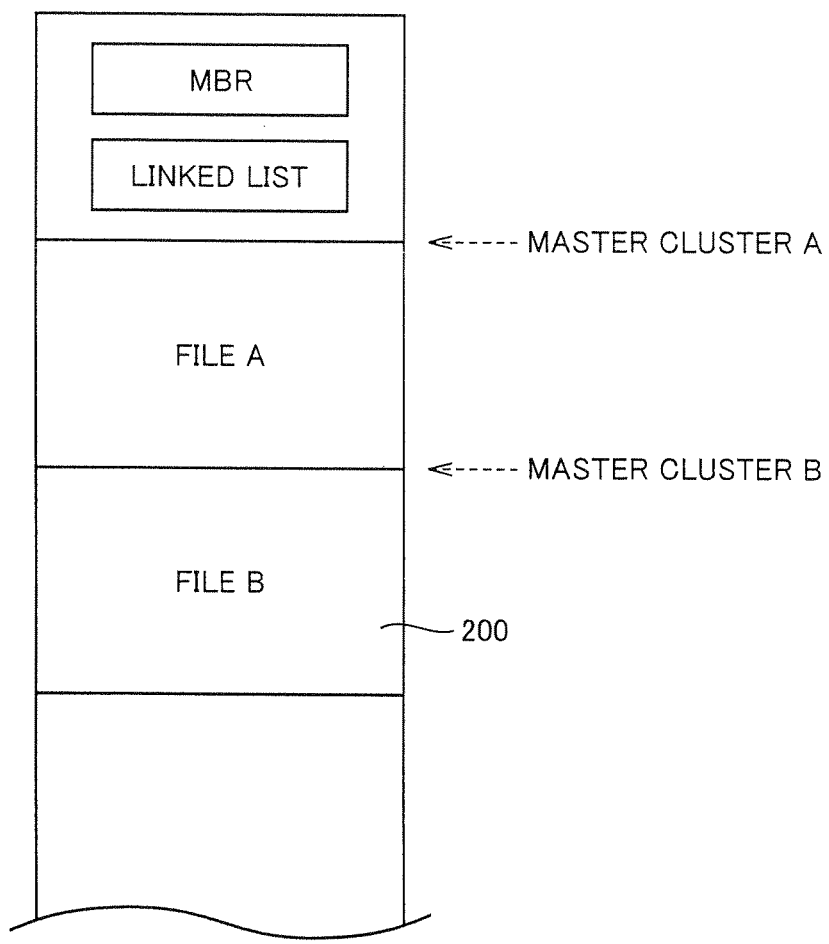
FIG. 8 shows an exemplary illustrative non-limiting schematic diagram illustrating a configuration of a file system of a flash memory.

An exemplary configuration of a file system in a flash memory will be described with reference to FIG. 8. By way of example, FIG. 8 shows an example where a file A and a file B are stored. In accordance with the FAT system, in addition to MBR, a linked list is stored. In this linked list, a master cluster number of each of file A and file B stored in the flash memory is described. The cluster refers to a unit size of a storage area managed under the FAT system.

In the present embodiment, a master cluster number of a storage area in which area 200 has been allocated and information on a cluster used by area 200 are written in the linked list. By thus describing the linked list, the entire area 200 including area of use 202 and protection area 204 is handled as one file. Namely, the memory management function according to the present embodiment writes management information (file management information) for handling area 200 as a single file into a flash memory. Thus, a plurality of files written in area 200 are managed as files in a file system different from a file system handling a single file.

When another information processing apparatus refers to the linked list of MBR shown in FIG. 8, it recognizes that the flash memory stores file A and file B. Therefore, even an information processing apparatus not incorporating the memory management function according to the present embodiment can copy file B (area 200) or perform other operations. Unless the memory management function according to the present embodiment is incorporated, area of use 202 and protection area 204 included in area 200 cannot basically be distinguished from each other, as will be described later. Therefore, security of data stored in area of use 202 can also be ensured.

In addition, since file management information is created in accordance with a general-purpose file system (FAT file system), it can be made use of also in other information processing apparatuses. Thus, other information processing apparatuses can recognize a single file (area 200) and can perform reading, copying, or the like of this single file.

[d4: Distinction Between Area of Use and Protection Area]

A configuration for distinguishing between area of use 202 and protection area 204 included in area 200 will now be described.

An information processing apparatus incorporating the memory management function according to the present embodiment distinguishes between area of use 202 and protection area 204 in area 200 based on specific management information included in area 200 (area management information). Namely, in allocating area 200 in a flash memory in the present embodiment, area management information for distinguishing between area of use 202 and protection area 204 included in area 200 is also written in the flash memory.

By way of example, area management information 210 for distinguishing between area of use 202 and protection area 204 is stored in a predetermined position in area 200.

Figure 9:
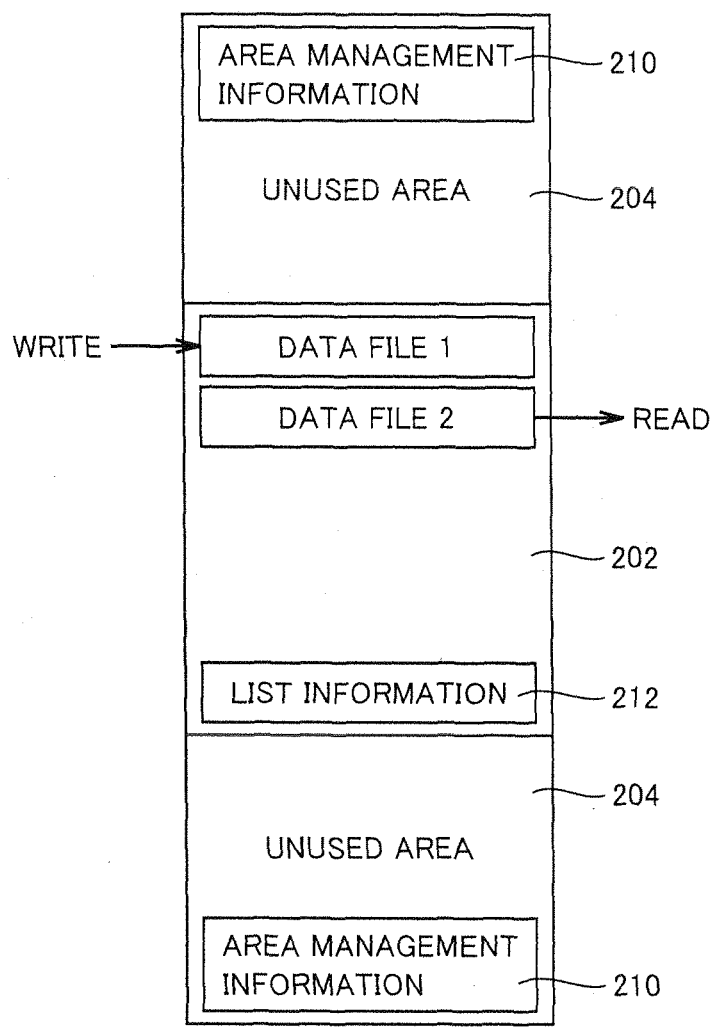
FIG. 9 shows an exemplary illustrative non-limiting schematic diagram illustrating more detailed data arrangement in an area allocated in the exemplary embodiment.

More detailed data arrangement in area 200 allocated in the present embodiment will be described with reference to FIG. 9. FIG. 9 shows an example where area management information 210 is arranged at a forward end portion and a terminal end portion of area 200. Since a position of area 200 has been obtained in advance, a position of area management information 210 can readily be specified. Though area management information 210 may be arranged only in one of the forward end portion and the terminal end portion of area 200, area management information 210 is arranged on each of opposing sides for more redundancy, because it becomes difficult to specify a position of area of use 202 in the event that contents in area management information 210 are lost due to an error caused by access to an adjacent area. In addition, by embedding area management information in area 200 handled as a single file, the function according to the present embodiment is maintained even though it is copied to another flash memory.

Alternatively, area management information 210 may be stored together with the linked list of the master cluster (MBR) of the flash memory. By including area management information 210 in MBR, management can readily be achieved even when a plurality of areas 200 are allocated in one flash memory. Namely, area management information 210 may be stored in a master cluster (MBR) which is an area for managing a file stored in a storage area of a flash memory.

Information stored in this area management information 210 may be mounted as follows.

(1) MOUNT EXAMPLE NO. 1

As a first mount example, a method of describing an offset amount from a forward end of area 200 to a forward end (a start position) of area of use 202 and an offset amount from a terminal end of area 200 to a terminal end (an end position) of area of use 202 is exemplified. In other words, each offset amount means a size of each protection area 204. Since an address of each of the forward end and the terminal end of area 200 has already been known, a position of area of use 202 can be specified by such information on offset.

Thus, area management information 210 includes an offset value indicating a size from an adjacent area for storing data different from data stored in area of use 202 to area of use 202. Thus, a position of area of use 202 included in area 200 can readily be specified.

(2) MOUNT EXAMPLE NO. 2

As a second mount example, a method of including in area management information 210, a parameter for calculating a start position of area of use 202 in area 200 in accordance with a prescribed calculating formula is exemplified. Such a parameter includes a value for calculating protection area 204, the number of unit clusters, or the like. By performing operational processing in accordance with a concealed function and in accordance with such a parameter, an offset amount as described above can be calculated. This calculated offset amount enables distinction between area of use 202 and protection area 204 included in area 200.

By adopting a method of specifying a position of area of use 202 by using such a calculating formula, confidentiality of data stored in area of use 202 can be enhanced.

(3) MOUNT EXAMPLE NO. 3

The file management information and area management information 210 described above may be integrated as management information. In this case, two pieces of management information may be stored in any area described above.

[d5: Arbitrary Storage of Files]

As described above, with the memory management function according to the present embodiment, since protection area 204 not used for storage of data is provided on one side or on each of opposing sides of area of use 202, efficiency in use of a storage area is lowered. Therefore, if a large number of areas 200 are allocated in a storage area in a flash memory, an area for storing necessary data may not sufficiently be secured.

Then, in a certain mount example, a plurality of pieces of data may successively be written in area of use 202. Namely, a plurality of files may be written in area of use 202 handled as a single file.

Referring again to FIG. 9, area of use 202 having a prescribed storage capacity is allocated in advance and a plurality of files (a data file 1, a data file 2, ... ) may be written in this area of use 202 as appropriate. Here, since what kind of file is stored in area of use 202 should be identified, information for identifying these files is also stored.

More specifically, list information 212 as shown in FIG. 9 may be stored in area of use 202. This list information 212 includes a start position and an end position of a file stored in area of use 202 (or a boundary position between files) as well as information on each file (a file name, attribute information). By referring to this list information 212, each file stored as appropriate in area of use 202 can independently be handled.

[d6: Re-Setting]

As described above, in the present embodiment, since the entire area 200 including area of use 202 and protection area 204 is handled as one file, area 200 (file) allocated in a certain flash memory may be copied to another flash memory. Alternatively, there is also a case where area 200 (file) is once stored in a hard disk or the like for file back-up and thereafter it is again written in the flash memory.

In such a case, since it is unknown at which position in the logical memory space area 200 is written, relation with a boundary of an erase block in the physical memory space deviates from relation at the time of original allocation. In addition, a size of an erase block in the flash memory in which area 200 has been written may be different from the size of the original flash memory.

As described above, by setting a size of protection area 204 to a maximum size of an erase block in a commercially available flash memory, data stored in area of use 202 can be protected in whichever position area 200 may be written.

On the other hand, in the case where correspondence between the physical memory space and the logical memory space has already been known, in the case where a size of an erase block in a flash memory can be obtained, or the like, a size or the like of protection area 204 may be optimized under conditions of a new storage location. Namely, a position, a size, and the like of area 200 stored in some flash memory may be evaluated, and protection area 204 in area 200 may be allocated again based on a result of such evaluation.

More specifically, area 200 where data to be protected is stored is specified in a storage area in a flash memory, and appropriateness is evaluated by associating area of use 202 and protection area 204 allocated in specified area 200 with a block (an erase block) regarding the flash memory. Then, when evaluation as inappropriate is made, protection area 204 is allocated again. In this evaluation of appropriateness, whether or not there is a possibility of storage of another piece of data for any erase block corresponding to area of use 202 is determined based on a size of an erase block or on correspondence between the physical memory space and the logical memory space.

<E. Functional Block>

Figure 10:
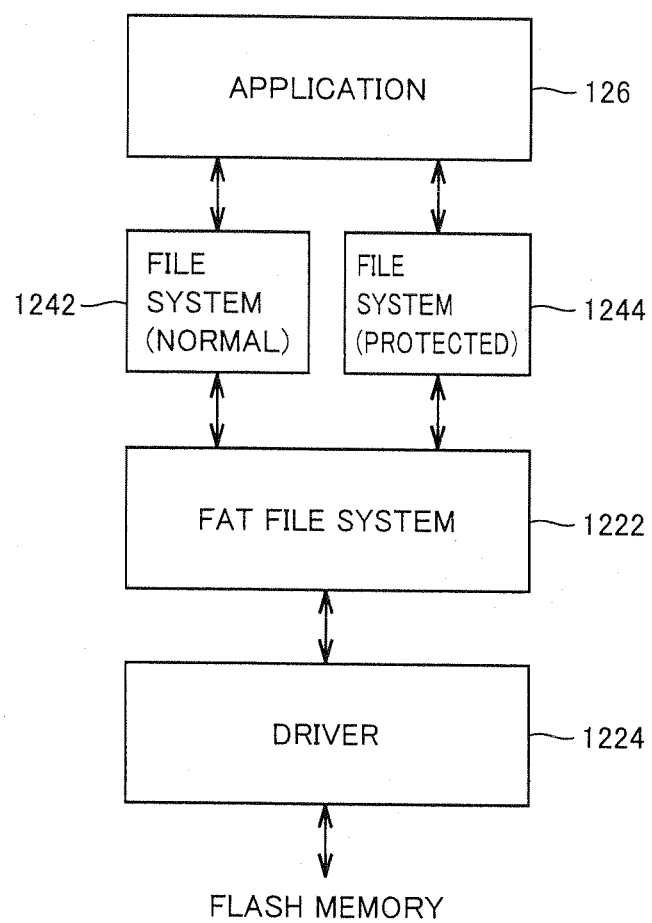
FIG. 10 shows an exemplary illustrative non-limiting schematic diagram illustrating a functional block for realizing the memory management function according to the exemplary embodiment.

A functional block for realizing the memory management function according to the present embodiment will now be described with reference to FIG. 10.

In processor 100, application 126, file systems 1242 and 1244, an FAT file system 1222, and a driver 1224 are executed in coordination. File systems 1242 and 1244 are functions provided by memory manager 124. More specifically, file system 1242 is an interface with application 126 for normal writing/reading of data into and from a flash memory. Meanwhile, file system 1244 is an interface with application 126 for writing/reading data into and from an area protected against an error caused by writing of data in an adjacent area.

Application 126 exchanges data with any of file system 1242 and file system 1244, depending on a type of handled data, a user's operation, or the like. For example, application 126 writes relatively important data such as various setting values and information for encryption in area of use 202 in area 200 through file system 1244. In contrast, application 126 writes data relatively lower in importance in area of use 202 through file system 1244.

By exchanging data with FAT file system 1222, both of file systems 1242 and 1244 realize an operation requested from application 126 (data writing and reading). File system 1244 also provides an instruction to FAT file system 1222, for creation and updating of area management information 210 and list information 212 described above.

FAT file system 1222 and driver 1224 are provided by basic system 122. FAT file system 1222 writes and reads data into and from a flash memory by giving an instruction to driver 1224 under prescribed rules. Driver 1224 instructs a flash memory of interest to write and read data, in coordination with memory interface 112 (FIG. 1).

<F. Processing Procedure>

A processing procedure involved with the memory management function according to the present embodiment will now be described with reference to FIG. 11. Each step shown in FIG. 11 is realized by execution of basic system 122, memory manager 124, and application 126 by processor 100 shown in FIG. 1.

Initially, processor 100 determines whether or not it is necessary to allocate area 200 for storing relatively important data in a storage area in a flash memory (step S100). Specifically, when area 200 is not present in a flash memory after the flash memory is attached to information processing apparatus 1, it is determined that allocation of area 200 is necessary. Alternatively, after a flash memory has been initialized (formatted), it is determined that allocation of area 200 is necessary. When it is determined that it is not necessary to allocate area 200 in a storage area in a flash memory (NO in step S100), processing in step S100 is repeated.

When it is determined that it is necessary to allocate area 200 in a storage area in a flash memory (YES in step S100), processor 100 determines a size of area of use 202 (step S102). A size of this area of use 202 may be requested by application 126 or it may also be determined in accordance with an amount of data to be written.

In succession, processor 100 determines a size of protection area 204 (step S104). Processor 100 determines a size of protection area 204 by obtaining or estimating a size of an erase block in a flash memory, writing in which is to be carried out. As described above, various mount forms are possible as a method of determining a size of this protection area 204.

In addition, processor 100 allocates area 200 including area of use 202 and protection area 204 in a storage area in a flash memory (step S106). Area 200 is allocated in this flash memory by updating contents in the linked list of the master cluster (MBR) (see FIG. 8). Moreover, processor 100 writes area management information 210 for distinguishing between area of use 202 and protection area 204 included in area 200, in protection area 204 or in the master cluster (MBR).

Through the processing above, allocation of area 200 in a storage area in a flash memory is completed.

In succession, processor 100 determines whether or not it is necessary to evaluate protection area 204 included in area 200 (step S110). As described above, in the case where area 200 is copied from another flash memory or in the case where area 200 backed up in a hard disk is again written, it is determined that it is necessary to evaluate protection area 204 included in area 200. When it is determined that it is not necessary to evaluate protection area 204 included in area 200 (NO in step S110), the processing in steps S112 to S116 is skipped.

When it is determined that it is necessary to evaluate protection area 204 included in area 200 (YES in step S110), processor 100 specifies area 200 in a storage area in a flash memory (step S112). In succession, processor 100 evaluates appropriateness of area of use 202 and protection area 204 allocated in specified area 200 in association with an erase block for that flash memory. Namely, processor 100 determines whether or not area of use 202 and protection area 204 allocated in specified area 200 are appropriate (step S114). As described above, processor 100 obtains information on an erase block in a flash memory of interest with various methods, and determines whether or not a size and/or a position or the like of protection area 204 are/is appropriate, based on this obtained information.

When it is determined that area of use 202 and protection area 204 are appropriate (YES in step S114), the processing in step S116 is skipped and no change to area of use 202 and protection area 204 is made.

In contrast, when it is determined that area of use 202 and protection area 204 are not appropriate (NO in step S114), processor 100 re-allocates protection area 204 (step S116). Typically, a size of protection area 204 is increased.

Through the processing above, even when area 200 is copied to any flash memory, data stored in area of use 202 can be protected.

In succession, processor 100 determines whether or not writing of data in a flash memory has been requested (step S120). When writing of data in a flash memory has not been requested (NO in step S120), the process proceeds to step S130.

When writing of data in a flash memory has been requested (YES in step S120), processor 100 determines whether or not nominal data writing has been requested (step S122). When normal data writing has been requested (YES in step S122), processor 100 writes requested data in a storage area other than area 200 in a flash memory in accordance with a normal procedure (step S124). Then, the process proceeds to step S130.

On the other hand, when normal data writing has not been requested (NO in step S122), that is, when writing of data in area of use 202 in area 200 has been requested, processor 100 writes requested data in area of use 202 in area 200 allocated in a flash memory (step S126). In addition, processor 100 adds information for specifying data written in area of use 202 to list information 212 (step S128). Then, the process proceeds to step S130.

In succession, processor 100 determines whether or not reading of data from a flash memory has been requested (step S130). When reading of data from a flash memory has not been requested (NO in step S130), the processing in step S110 and subsequent steps is repeated.

When reading of data from a flash memory has been requested (YES in step S130), processor 100 determines whether or not normal data reading has been requested (step S132). When normal data reading has been requested (YES in step S132), processor 100 reads requested data from a storage area other than area 200 in a flash memory in accordance with a normal procedure (step S134). Then, the processing in step S110 and subsequent steps is repeated.

On the other hand, when normal data reading has not been requested (NO in step S132), that is, when reading of data from area of use 202 in area 200 has been requested, processor 100 specifies a position where data of which reading has been requested is stored, by referring to list information 212 (step S136). In succession, processor 100 reads requested data from area of use 202 in area 200 based on the specified position (step S138). Then, the processing in step S110 and subsequent steps is repeated.

<G. Other Forms>

A program alone for realizing the memory management function according to the embodiment may be provided. Such a program may be distributed through a network or provided through a non-transitory storage medium such as a CD-ROM or a DVD. The memory management function according to the embodiment may be implemented by an information processing system which is combination of a storage medium storing a program including instructions for providing each function and at least one operation processing unit (processor) capable of reading and executing a program stored in the storage medium.

According to another embodiment, some of functions necessary for the memory management function may be performed by a plurality of processing entities. Typically, a series of processes necessary for the memory management function according to the present embodiment may be performed as distributed among a plurality of processing entities like what is called a cloud system.

While certain example systems, methods, devices, and apparatuses have been described herein, it is to be understood that the appended claims are not to be limited to the systems, methods, devices, and apparatuses disclosed, but on the contrary, are intended to cover various modifications and equivalent arrangements included within the spirit and scope of the appended claims.

What is claimed is:

1. A non-transitory storage medium encoded with a computer readable program executable by a computer for writing data in a particular semiconductor storage device capable of storing a plurality of bits in one memory cell, said program causing said computer to perform:
    an allocation step of allocating a first area for storing first data in a storage area of said semiconductor storage device, wherein the area allocated includes at least one protection area of a predetermined size extending from a boundary of said first area and wherein at least a portion of a remaining area is defined as an area of use; and
    a writing step of writing said first data only in the area of use within the first area;
    wherein the at least one protection area has a size equal to a size of a block of physical memory which constitutes an erase block for said particular semiconductor storage device and wherein the protection area spans across a boundary between two adjacent erase blocks of said semiconductor storage device.

2. The non-transitory storage medium according to claim 1, wherein
    said allocation step includes a step of writing information for handling said first area as a single piece of data in said semiconductor storage device.

3. The non-transitory storage medium according to claim 2, wherein
    said allocation step includes a step of storing file management information to be used by said computer for handling said first area as a single file in said semiconductor storage device.

4. The non-transitory storage medium according to claim 2, wherein
    said allocation step includes a step of storing area management information to be used by said computer for distinguishing between said area of use and said protection area.

5. The non-transitory storage medium according to claim 4, wherein
    said storage area of said semiconductor storage device includes a second area used by said computer for storing information to be used for independently managing one or more files that are stored in the storage area, and
    said area management information is also stored in said second area.

6. The non-transitory storage medium according to claim 4, wherein
    said area management information is stored in said protection area.

7. The non-transitory storage medium according to claim 4, wherein
    said area management information includes an offset value indicating a storage area position within said area of use offset from a boundary of a third area within the storage area of the semiconductor storage device for storing second data different from said first data.

8. The non-transitory storage medium according to claim 4, wherein
said area management information includes a parameter for calculating a start position of said area of use in said first area in accordance with a prescribed calculating formula.

9. The non-transitory storage medium according to claim 1, wherein
said allocation step includes a step of determining a size of said protection area in association with a size of a block constituted of a plurality of memory cells of said semiconductor storage device.

10. The non-transitory storage medium according to claim 9, wherein
said size of said protection area is determined in association with a size of an erase block consisting of a predetermined plurality of memory cells of said semiconductor storage device and has a size which is not smaller than said erase block.

11. The non-transitory storage medium according to claim 10, wherein
said protection area is allocated to include an area from said area of use to a boundary of said erase block.

12. The non-transitory storage medium according to claim 9, wherein
said allocation step includes a step of obtaining a block size regarding a semiconductor storage device to be accessed, by obtaining identification information of the semiconductor storage device to be accessed and referring to a table in which the identification information and a block size are brought in correspondence with each other.

13. The non-transitory storage medium according to claim 9, wherein
said allocation step includes a step of obtaining by accessing a semiconductor storage device to be accessed, a block size regarding the semiconductor storage device.

14. The non-transitory storage medium according to claim 1, wherein
said writing step includes a step of writing a plurality of files in said first area handled as a single file.

15. The non-transitory storage medium according to claim 14, wherein
said plurality of files are managed as files in a file system different from a file system handling said single file.

16. The non-transitory storage medium according to claim 1, wherein
said program causes said computer to further perform:
an area specifying step of specifying the first area where said first data is stored in the storage area of said semiconductor storage device;
an evaluation step of evaluating appropriateness of the area of use and the protection area allocated to specified said first area, in association with a block regarding the semiconductor storage device; and
a re-allocation step of re-allocating said protection area when evaluation as inappropriate is made in said evaluation step.

17. An information processing system including at least one processor and a non-transitory storage medium encoded with a computer readable program having instructions executable by said at least one processor, said instructions when executed causing said at least one processor to operate and perform functions comprising:
allocating a first area for storing first data in a storage area of a semiconductor storage device, said semiconductor storage device being configured to store a plurality of bits in one memory cell, wherein an allocated area includes at least one protection area of a predetermined size extending from a boundary of said first area and wherein at least a portion of a remaining area is defined as an area of use; and
in response to a request to store the first data, write said first data only in the area of use within the first area;
wherein the at least one protection area has a size equal to a size of a block of physical memory which constitutes an erase block for said semiconductor storage device and wherein the protection area spans across a boundary between two adjacent erase blocks of said semiconductor storage device.

18. An information processing apparatus incorporating one or more processors which function and operate to write data in a particular semiconductor storage device capable of storing a plurality of bits in one memory cell, said one or more processors configured to:
allocate a first area for storing first data in a storage area of said semiconductor storage device, wherein an allocated area includes at least one protection area of a predetermined size extending from a boundary of said first area and wherein at least a portion of a remaining area is defined as an area of use; and
write said first data only in the area of use within the first area in response to a request to store said first data;
wherein the at least one protection area has a size equal to a size of a block of physical memory which constitutes an erase block for said particular semiconductor storage device and wherein the protection area spans across a boundary between two adjacent erase blocks of said semiconductor storage device.

19. An information processing method for writing data in a particular semiconductor storage device capable of storing a plurality of bits in one memory cell, which is performed using a computer processor, the method comprising:
allocating a first area for storing first data in a storage area of said semiconductor storage device, wherein an allocated area includes at least one protection area of a predetermined size extending from a boundary of said first area and wherein at least a portion of a remaining area is defined as an area of use; and
using said computer processor to write said first data only in the area of use within the first area;
wherein the at least one protection area has a size equal to a size of a block of physical memory which constitutes an erase block for said particular semiconductor storage device and wherein the protection area spans across a boundary between two adjacent erase blocks of said semiconductor storage device.

* * * * *